(12) United States Patent
Izumi et al.

(10) Patent No.: US 10,008,670 B2
(45) Date of Patent: Jun. 26, 2018

(54) LAMINATE, METHOD OF PEELING LAMINATE, AND METHOD OF MANUFACTURING FLEXIBLE DEVICE

(71) Applicant: JOLED INC., Chiyoda-ku (JP)

(72) Inventors: Kenichi Izumi, Tokyo (JP); Keisuke Shimokawa, Tokyo (JP); Shin Akasaka, Tokyo (JP); Hiroyuki Abe, Tokyo (JP); Shinpei Irie, Tokyo (JP); Takatoshi Saito, Tokyo (JP)

(73) Assignee: JOLED, Inc., Chiyoda-ku (JP)

( * ) Notice: Subject to any disclaimer, the term of this patent is extended or adjusted under 35 U.S.C. 154(b) by 117 days.

(21) Appl. No.: 15/272,741

(22) Filed: Sep. 22, 2016

(65) Prior Publication Data
US 2017/0012202 A1    Jan. 12, 2017

Related U.S. Application Data

(63) Continuation of application No. PCT/JP2015/059941, filed on Mar. 30, 2015.

(30) Foreign Application Priority Data

Mar. 31, 2014  (JP) .................................. 2014-073330
Oct. 17, 2014  (JP) .................................. 2014-212572

(51) Int. Cl.
*H01L 21/683*  (2006.01)
*H01L 27/12*   (2006.01)
(Continued)

(52) U.S. Cl.
CPC ............. *H01L 51/003* (2013.01); *B32B 7/06* (2013.01); *B32B 7/12* (2013.01); *B32B 43/006* (2013.01);
(Continued)

(58) Field of Classification Search
USPC ........ 156/247, 249, 701, 702, 718; 428/401, 428/41.7, 212, 213, 214, 217, 337, 354
See application file for complete search history.

(56) References Cited

U.S. PATENT DOCUMENTS 6,028,772 A *   2/2000  Suhir .................. H01L 23/3735
                                                           165/80.2
6,460,753 B1 * 10/2002  Suhir ...................... H01L 23/34
                                                           156/291
(Continued)

FOREIGN PATENT DOCUMENTS

JP      2011-142332       7/2011
JP      2012-131664       7/2012
(Continued)

OTHER PUBLICATIONS

International Search Report dated Jun. 30, 2015 in PCT/JP2015/059941, filed on Mar. 30, 2015 ( with English translation).

*Primary Examiner* — Sing P Chan
(74) *Attorney, Agent, or Firm* — Oblon, McClelland, Maier & Neustadt, L.L.P.

(57) ABSTRACT

A method of peeling a laminate according to the disclosure includes: forming a first adhesive layer on a first substrate, the first adhesive layer having adhesive force that satisfies the following Expression (1) and one or both of the following Expressions (2) and (3); firmly attaching a second substrate onto the first adhesive layer; forming a first functional layer on the second substrate; and peeling off the first substrate from the second substrate.

$$A < \sqrt{\frac{x^2}{L^2 + 4x^2}} \cdot \left(\sigma_{max} - \frac{6E \cdot h}{L^2} \cdot x\right) \quad (1)$$

(Continued)

-continued $$B' < C - \rho h g \quad (2)$$

$$1 = \frac{r}{r-d} \cdot \sqrt{d(2r-d)} \quad (3)$$

14 Claims, 13 Drawing Sheets

(51) Int. Cl.
    *H01L 51/00*     (2006.01)
    *H01L 51/56*     (2006.01)
    *B32B 7/06*     (2006.01)
    *B32B 7/12*     (2006.01)
    *B32B 43/00*     (2006.01)

(52) U.S. Cl.
    CPC .......... *H01L 21/6835* (2013.01); *H01L 27/12* (2013.01); *H01L 51/0024* (2013.01); *H01L 51/0097* (2013.01); *H01L 51/56* (2013.01); *B32B 2457/20* (2013.01); *H01L 2221/6835* (2013.01); *H01L 2221/68318* (2013.01); *H01L 2221/68386* (2013.01); *H01L 2227/323* (2013.01); *H01L 2227/326* (2013.01); *H01L 2251/5338* (2013.01)

(56) References Cited

U.S. PATENT DOCUMENTS

| | | | | |
|---|---|---|---|---|
| 6,629,553 | B2* | 10/2003 | Odashima | H01L 21/67144 156/716 |
| 8,545,962 | B2* | 10/2013 | Sheehan | B81B 3/0075 257/379 |
| 8,692,394 | B2* | 4/2014 | Lee | C08G 59/4014 257/798 |
| 9,153,471 | B2* | 10/2015 | Kim | C09J 7/385 |
| 9,382,455 | B2* | 7/2016 | Tsuchiyama | C09J 133/066 |
| 9,422,462 | B2* | 8/2016 | Saito | C09J 133/08 |
| 9,434,865 | B2* | 9/2016 | Tsuchiyama | C09J 143/04 |
| 9,437,473 | B2* | 9/2016 | Landru | H01L 21/2007 |
| 9,607,879 | B2* | 3/2017 | Landru | H01L 21/76251 |
| 9,714,364 | B2* | 7/2017 | Ohmori | C09J 4/00 |
| 2002/0024883 | A1* | 2/2002 | Odashima | H01L 21/67144 365/52 |
| 2002/0036895 | A1* | 3/2002 | Odashima | H01L 21/67144 361/737 |
| 2002/0046450 | A1* | 4/2002 | Odashima | H01L 21/67144 29/25.01 |
| 2002/0072202 | A1* | 6/2002 | Odashima | H01L 21/67144 438/460 |
| 2003/0116273 | A1* | 6/2003 | Nakamura | C09J 5/02 156/330 |
| 2004/0191564 | A1* | 9/2004 | Kim | H01L 51/0013 428/690 |
| 2004/0232413 | A1 | 11/2004 | Yamazaki et al. | |
| 2005/0118525 | A1* | 6/2005 | Kim | B41M 15/46 430/200 |
| 2005/0136344 | A1* | 6/2005 | Kang | B41M 5/42 430/18 |
| 2008/0138577 | A1* | 6/2008 | Sheehan | B81B 3/0075 428/141 |
| 2011/0210407 | A1* | 9/2011 | Katayama | C08G 73/1046 257/414 |
| 2011/0224593 | A1* | 9/2011 | Tunius | A61L 15/585 602/54 |
| 2012/0135187 | A1 | 5/2012 | Takimoto et al. | |
| 2012/0248634 | A1* | 10/2012 | Mitsukura | H01L 21/6836 257/798 |
| 2012/0267803 | A1* | 10/2012 | Lee | C08G 59/4014 257/798 |
| 2012/0301716 | A1* | 11/2012 | Terada | C09J 7/00 428/355 AC |
| 2012/0328863 | A1* | 12/2012 | Kuo | C09J 183/04 428/220 |
| 2013/0041093 | A1* | 2/2013 | Nakayama | C09J 133/00 524/556 |
| 2013/0071658 | A1* | 3/2013 | Nomura | C09J 11/06 428/355 R |
| 2013/0244401 | A1* | 9/2013 | Tsuchiyama | C09J 143/04 438/458 |
| 2013/0244402 | A1* | 9/2013 | Tsuchiyama | C09J 133/066 438/458 |
| 2013/0295747 | A1* | 11/2013 | Kim | C09J 133/066 438/464 |
| 2014/0134431 | A1* | 5/2014 | Saito | C09J 133/08 428/355 AC |
| 2014/0235746 | A1* | 8/2014 | Ohmori | C09J 4/00 522/167 |
| 2014/0242384 | A1* | 8/2014 | Takashima | C09J 133/02 428/354 |
| 2015/0221544 | A1* | 8/2015 | Landru | H01L 21/2007 438/458 |
| 2015/0231790 | A1* | 8/2015 | Landru | B26D 3/28 156/762 |
| 2016/0368177 | A1* | 12/2016 | Kasai | B29C 33/68 |
| 2016/0368259 | A1* | 12/2016 | Landru | H01L 21/2007 |
| 2017/0221746 | A1* | 8/2017 | Arinnoto | H01L 21/67703 |
| 2017/0233619 | A1* | 8/2017 | Nakada | C09J 153/00 524/272 |
| 2018/0016431 | A1* | 1/2018 | Nakada | C08L 53/00 |

FOREIGN PATENT DOCUMENTS

| | | |
|---|---|---|
| JP | 2012-215737 | 11/2012 |
| JP | 2013-35159 | 2/2013 |
| JP | 2013-237159 | 11/2013 |
| JP | 2014-8697 | 1/2014 |
| JP | 2014-19597 | 2/2014 |

\* cited by examiner

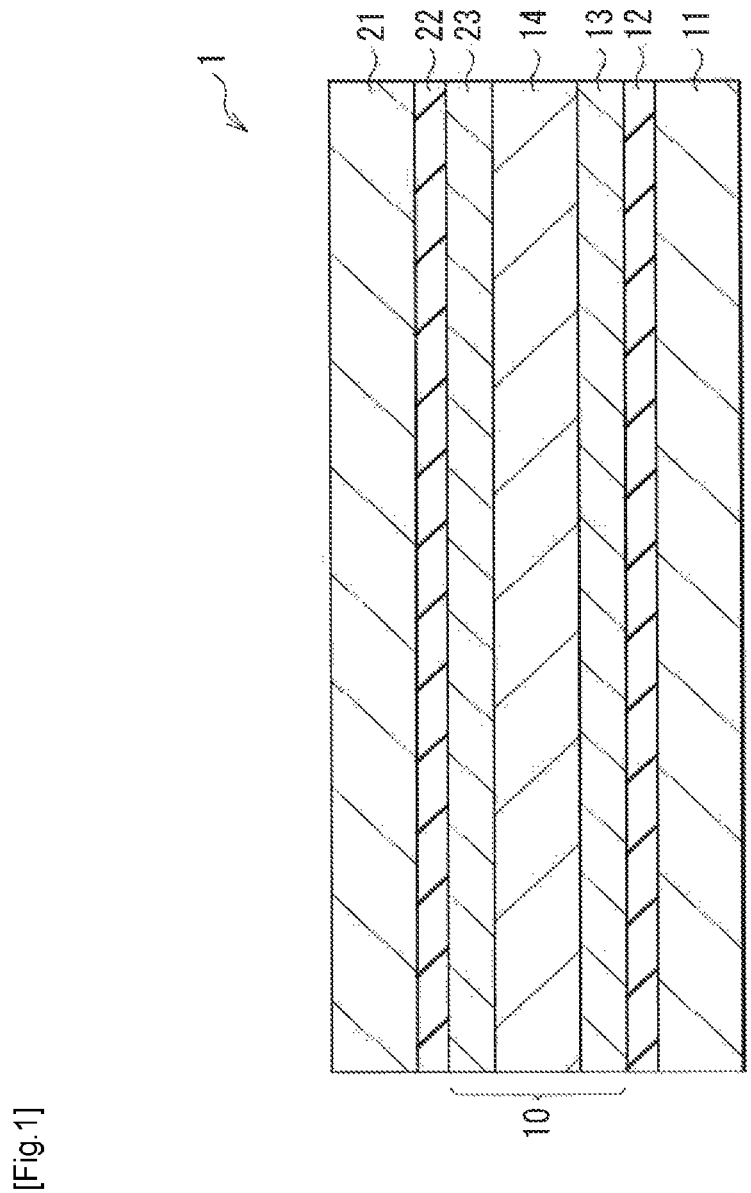
[Fig.1]

[Fig.2]
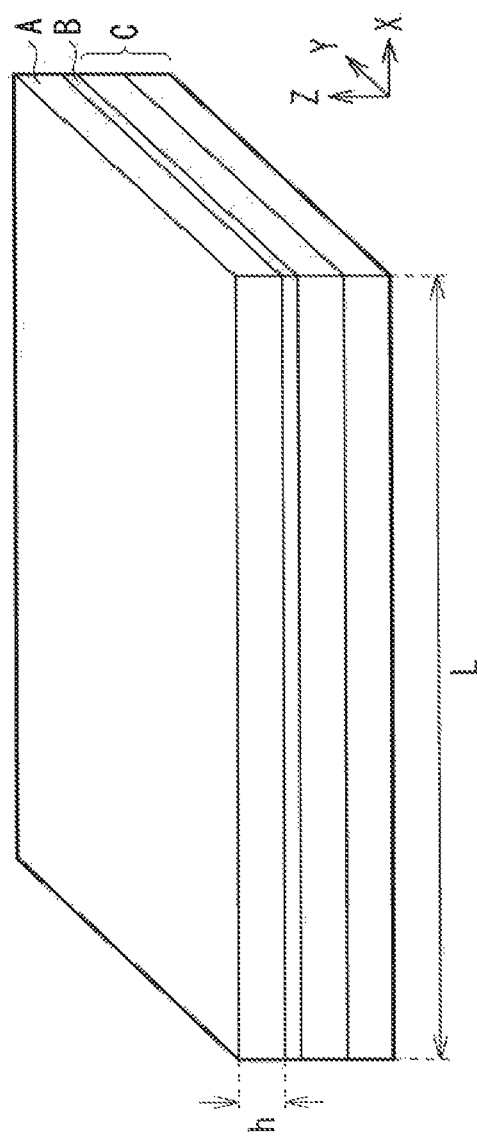

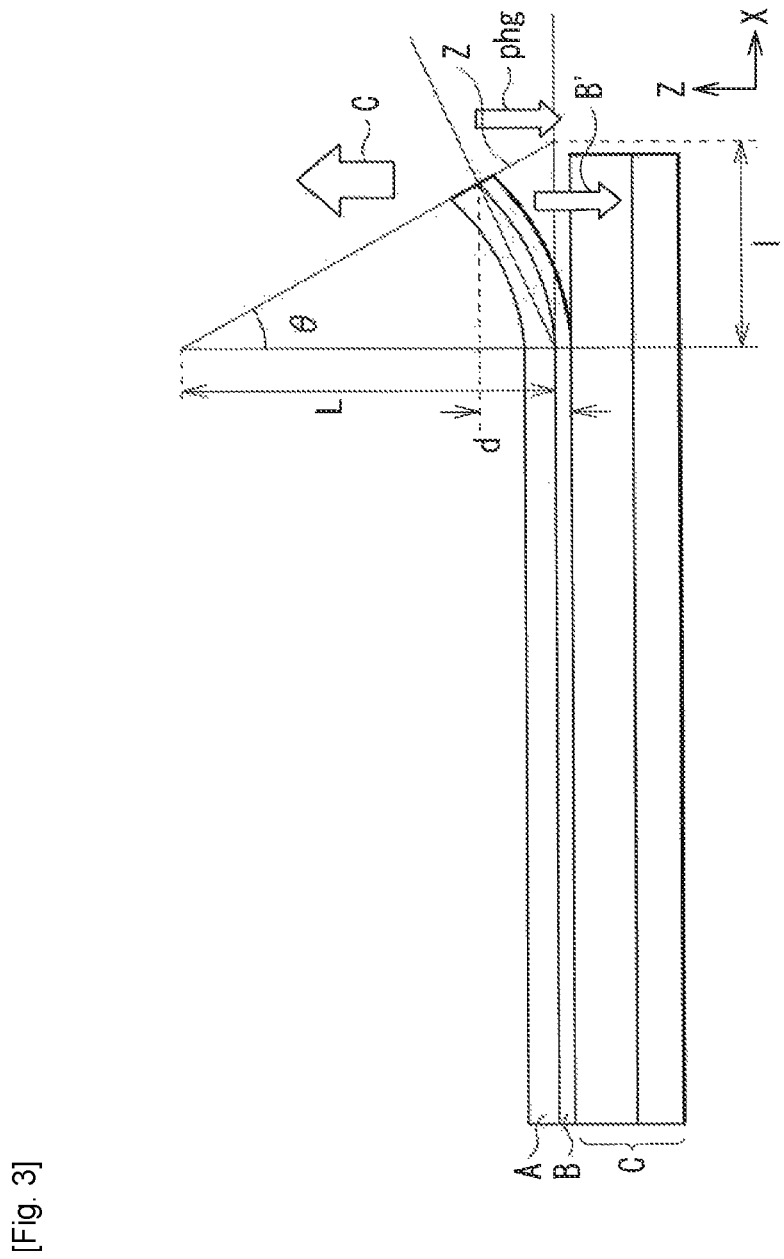
[Fig. 3]

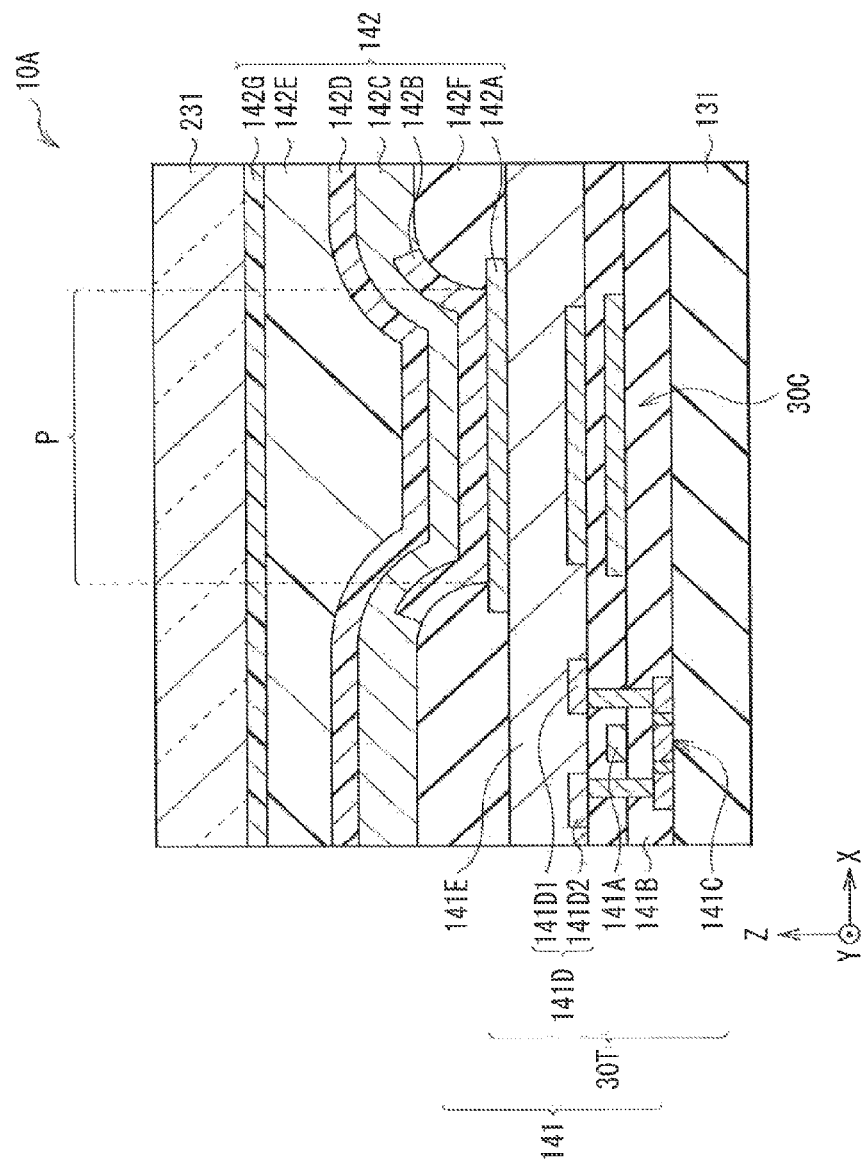
[Fig. 4]

[ FIG. 5 ]
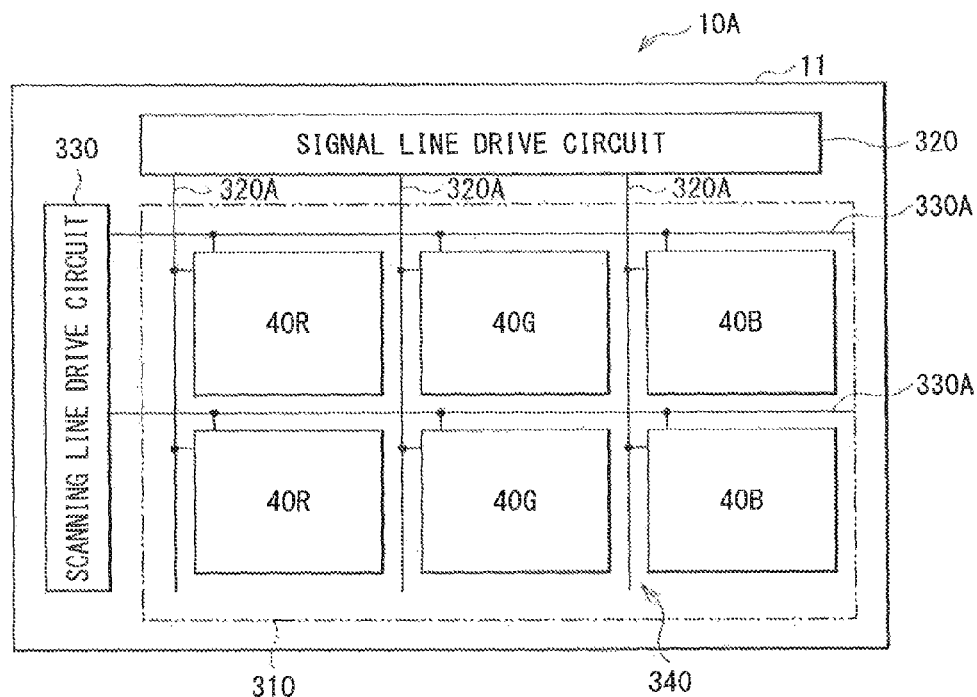
[ FIG. 6 ]
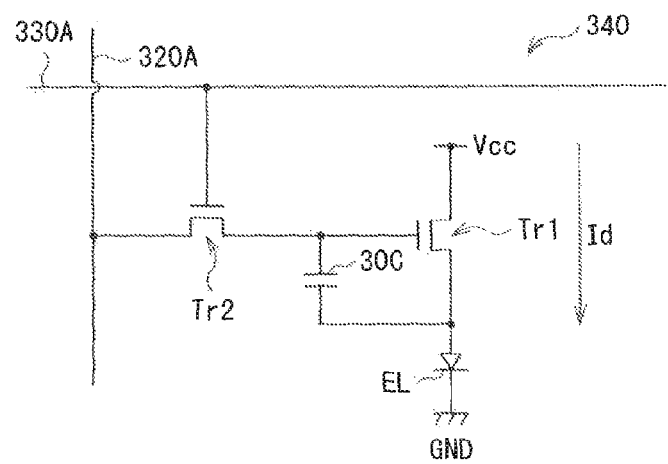

[ FIG. 7A ]
[ FIG. 7B ]
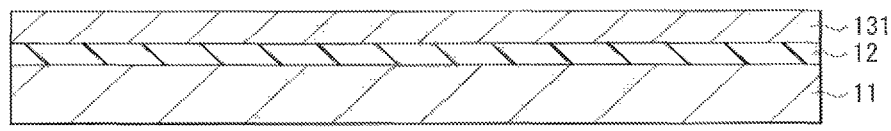
[ FIG. 7C ]
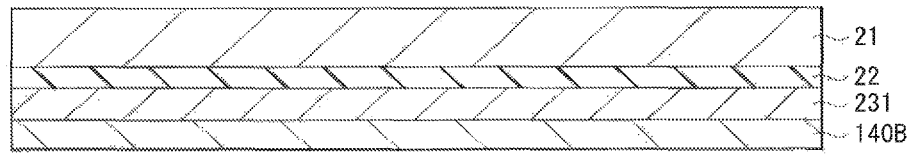
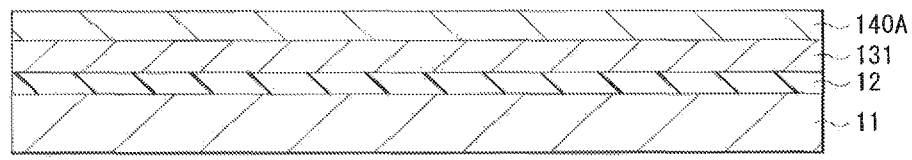

[ FIG. 8A ]
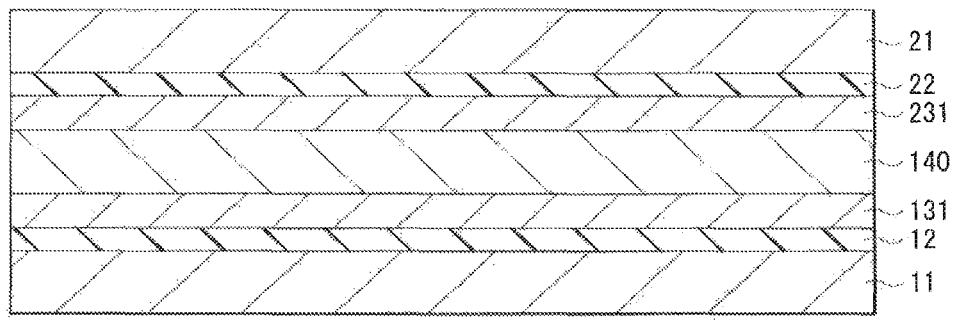
[ FIG. 8B ]
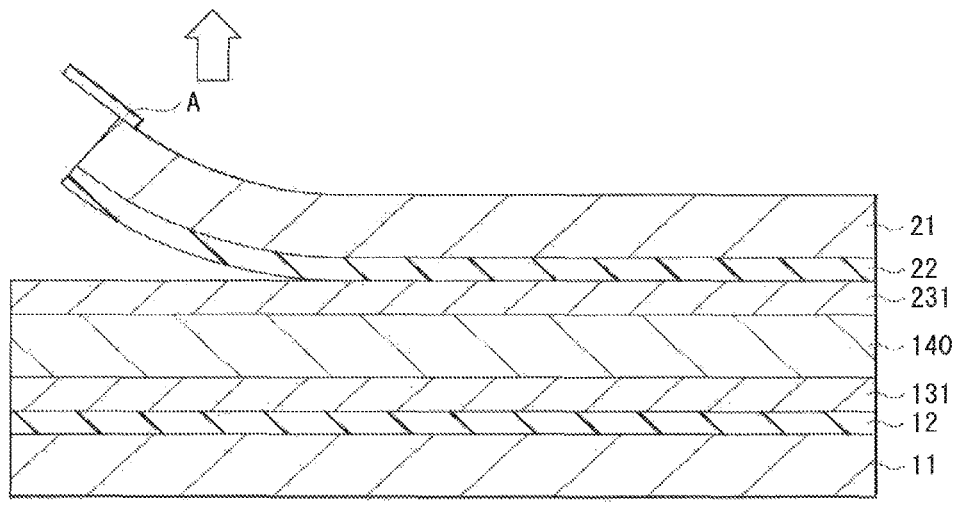
[ FIG. 8C ]
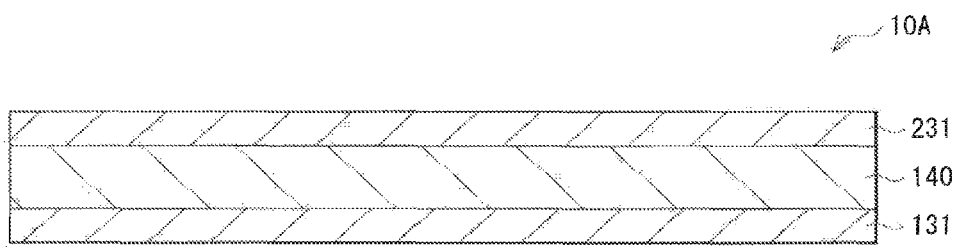

[ FIG. 9A ]
[ FIG. 9B ]
[ FIG. 9C ]
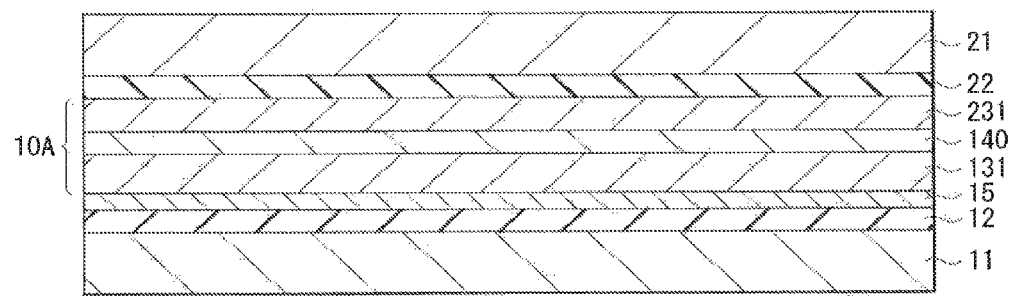

[ FIG. 10A ]
[ FIG. 10B ]
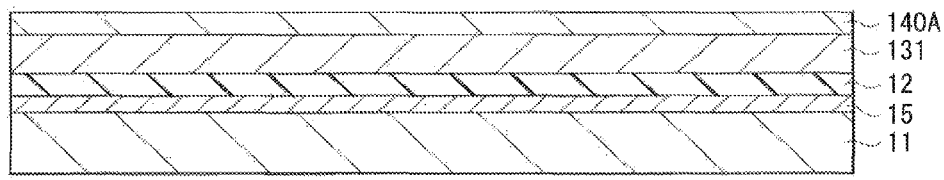
[ FIG. 10C ]
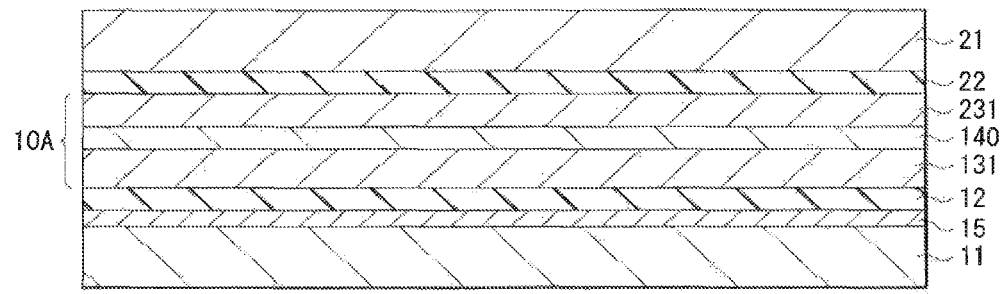

[ FIG. 11A ]
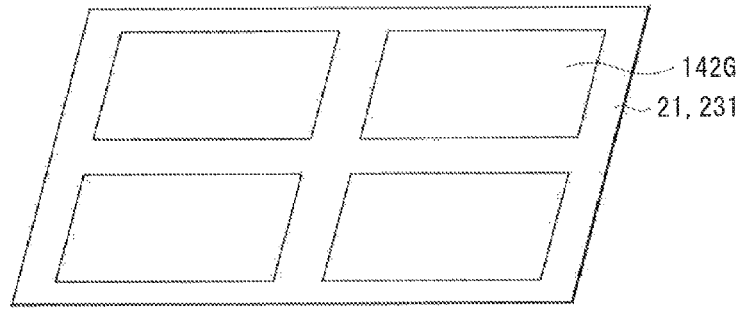
[ FIG. 11B ]
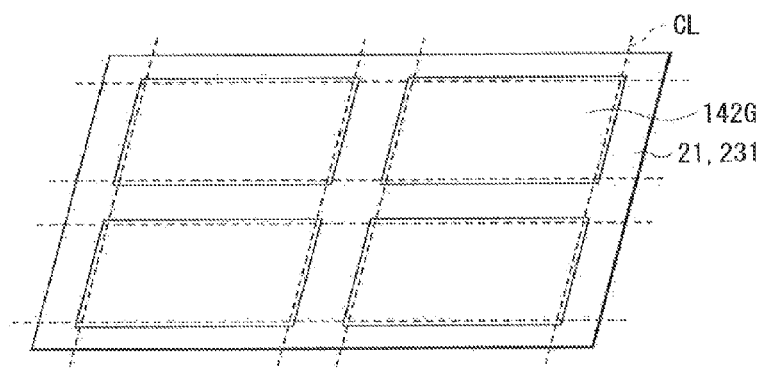
[ FIG. 11C ]
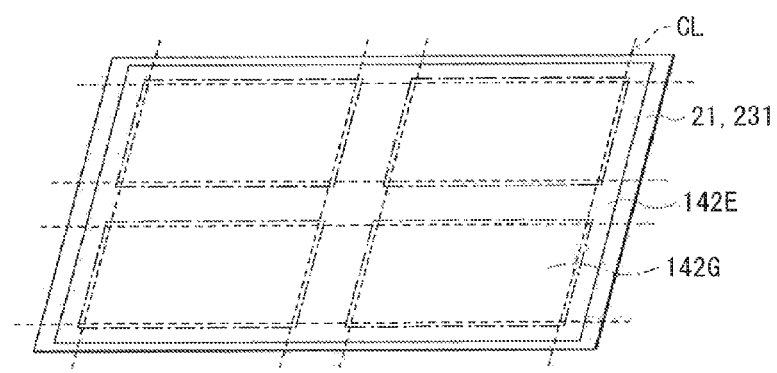

[ FIG. 12A ]
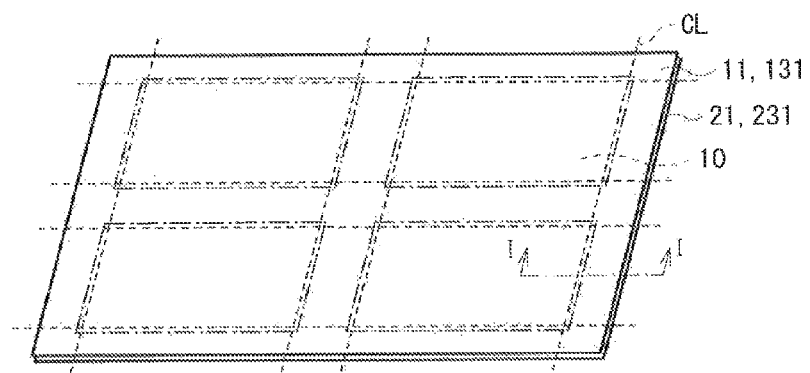
[ FIG. 12B ]
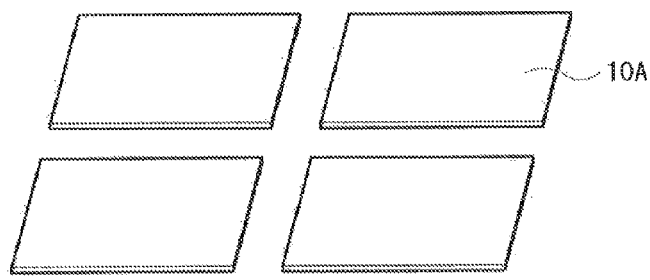
[ FIG. 13 ]
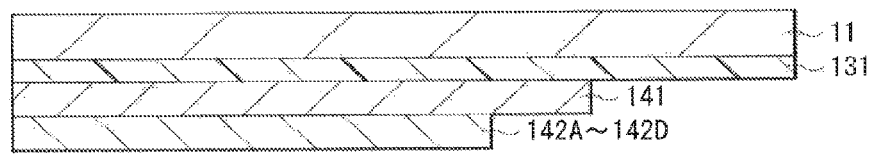

[ FIG. 14A ]
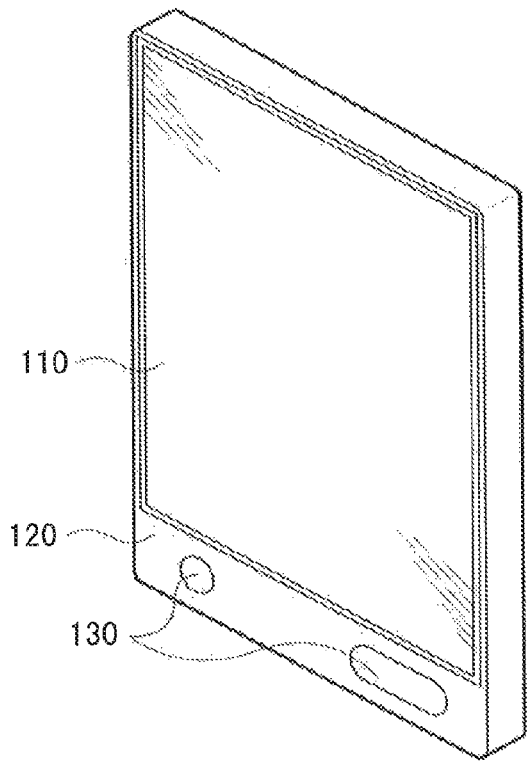
[ FIG. 14B ]
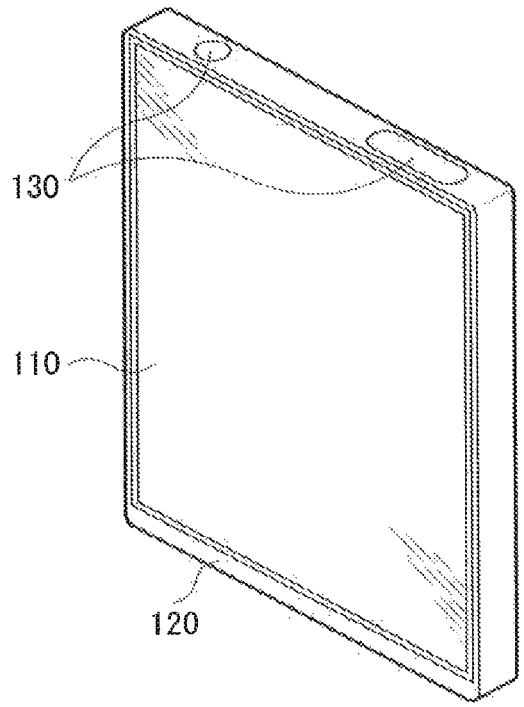

[ FIG. 15 ]
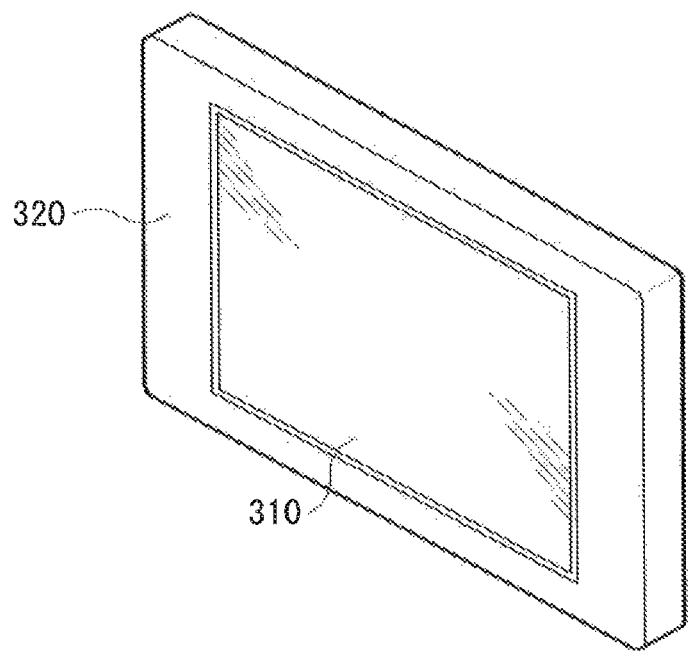

LAMINATE, METHOD OF PEELING LAMINATE, AND METHOD OF MANUFACTURING FLEXIBLE DEVICE

CROSS REFERENCE TO RELATED APPLICATIONS

This is a continuation of International Application No. PCT/JP2015/059941, filed Mar. 30, 2015, which claims the benefit of Japanese Priority Patent Application JP2014-073330, filed Mar. 31, 2014, and Japanese Priority Patent Application JP2014-212572, filed Oct. 17, 2014 the entire contents of all of which are incorporated herein by reference.

BACKGROUND

The technology relates to a laminate that may include, for example, a substrate having rigidity and a substrate having flexibility that are attached to each other. The technology also relates to a method of peeling the laminate, and to a method of manufacturing a flexible device that utilizes the laminate.

A display device that has flexibility such as a flexible display may be manufactured as follows, for example. First, a substrate having flexibility (a flexible substrate) is fixed onto each of a pair of substrates having rigidity (support substrates). The pair of substrates having rigidity may be made of glass, for example. Functional layers such as a thin film transistor (TFT) layer, a display layer, and a color filter are formed on each of the flexible substrates. Thereafter, the functional layers formed on one of the flexible substrates and the functional layers formed on the other of the flexible substrates may be attached to each other in an opposed manner, following which the support substrates may be peeled off from the respective flexible substrates. This completes the flexible display (for example, see Japanese Unexamined Patent Application Publication No. 2012-215737).

Disclosed examples of a method of peeling off the flexible substrate and the support substrate from each other are: a method in which a metal layer is provided on the support substrate, and the metal layer is irradiated with a laser to be peeled off (for example, see Japanese Unexamined Patent Application Publication No. 2011-142332 (JPA2011-142332)); and a method in which a bonding agent is applied only onto part of the flexible substrate (for example, onto a periphery of the flexible substrate), thereby making it easier to peel off the support substrate and the flexible substrate from each other.

SUMMARY

However, the use of a laser such as that in JPA2011-142332 has led to a concern such as an increase in cost due to the use of the laser, and degradation of the functional layers due to heat generated by laser application. Also, fixing only part of the flexible substrate has easily led to a concern such as a shift in position due to insufficient fixation of the flexible substrate, making it difficult to form a high-definition functional layer.

It is therefore desirable to provide a laminate, a method of peeling a laminate, and a method of manufacturing a flexible device that utilizes the laminate that make it possible to perform peeling easily at low cost without causing degradation of the functional layer.

A method of peeling a laminate according to an embodiment of the technology includes: forming a first adhesive layer on a first substrate, the first adhesive layer having adhesive force that satisfies the following Expression (1) and one or both of the following Expressions (2) and (3); firmly attaching a second substrate onto the first adhesive layer; forming a first functional layer on the second substrate; and peeling off the first substrate from the second substrate, $$A < \sqrt{\frac{x^2}{L^2+4x^2}} \cdot \left(\sigma_{max} - \frac{6E \cdot h}{L^2} \cdot x\right) \qquad (1)$$

where "L" is a length of the first substrate in a direction in which the first substrate is peeled off, "h" is a thickness of the first substrate in millimeter, "x" is an allowable deformation amount of the first substrate, "E" is a Young's modulus of the first substrate, and "$\sigma_{max}$" is a limit bending stress of the first substrate, $$B' < C - \rho h g \qquad (2)$$

where "B" is adhesive force between the first substrate and the second substrate at a peeling start part when the peeing is performed, "C" is peeling force in a vertical direction (in a Z-axis direction) when the peeling is performed, "ρ" is a density of the first substrate, "h" is the thickness of the first substrate in millimeter, and "g" is gravitational constant, $$1 = \frac{r}{r-d} \cdot \sqrt{d(2r-d)} \qquad (3)$$

where "l" is a width of a region in which the peeling is started, "d" is an amount of projection and warpage of the first substrate, and "r" is a curvature radius.

A method of manufacturing a flexible device according to an embodiment of the technology includes: forming an adhesive layer on a first substrate, the adhesive layer having adhesive force that satisfies the following Expression (1) and one or both of the following Expressions (2) and (3); fixing a second substrate onto the adhesive layer, the second substrate having flexibility; forming a functional layer on the second substrate; and peeling off the first substrate from the second substrate, $$A < \sqrt{\frac{x^2}{L^2+4x^2}} \cdot \left(\sigma_{max} - \frac{6E \cdot h}{L^2} \cdot x\right) \qquad (1)$$

where "L" is a length of the first substrate in a direction in which the first substrate is peeled off, "h" is a thickness of the first substrate in millimeter, "x" is an allowable deformation amount of the first substrate, "E" is a Young's modulus of the first substrate, and "$\sigma_{max}$" is a limit bending stress of the first substrate, $$B' < C - \rho h g \qquad (2)$$

where "B" is adhesive force between the first substrate and the second substrate at a peeling start part when the peeing is performed, "C" is peeling force in a vertical direction (in a Z-axis direction) when the peeling is performed, "ρ" is a density of the first substrate, "h" is the thickness of the first substrate in millimeter, and "g" is gravitational constant, $$1 = \frac{r}{r-d} \cdot \sqrt{d(2r-d)} \quad (3)$$

where "l" is a width of a region in which the peeling is started, "d" is an amount of projection and warpage of the first substrate, and "r" is a curvature radius.

A laminate according to an embodiment of the technology includes: a first substrate having rigidity; a second substrate having flexibility; and an adhesive layer provided between the first substrate and the second substrate, and having adhesive force that satisfies the following Expression (1), $$A < \sqrt{\frac{x^2}{L^2 + 4x^2}} \cdot \left(\sigma_{max} - \frac{6E \cdot h}{L^2} \cdot x\right) \quad (1)$$

where "L" is a length of the first substrate in a direction in which the first substrate is peeled off, "h" is a thickness of the first substrate in millimeter, "x" is an allowable deformation amount of the first substrate, "E" is a Young's modulus of the first substrate, and "$\sigma_{max}$" is a limit bending stress of the first substrate.

The laminate, the method of peeling the laminate, and the method of manufacturing the flexible device according to some embodiments of the technology make it possible to mechanically peel off the first substrate and the second substrate from each other, by forming, between the first substrate and the second substrate, the adhesive layer having the adhesive force that satisfies the foregoing Expression (1) and one or both of the foregoing Expressions (2) and (3).

According to the laminate, the method of peeling the laminate, and the method of manufacturing the flexible device according to some embodiments of the technology, the adhesive layer having the adhesive force that satisfies the foregoing Expression (1) and one or both of the foregoing Expressions (2) and (3) is formed between the first substrate and the second substrate, making it possible to mechanically peel off the first substrate and the second substrate from each other. More specifically, this makes it possible to peel off the first substrate and the second substrate from each other more easily at lower cost, without causing degradation of the functional layer when the peeling is performed. It is to be noted that the effects described above are not limitative, and any of the effects described in the disclosure may be provided.

BRIEF DESCRIPTION OF THE DRAWINGS

FIG. 1 is a cross-sectional view of a configuration of a laminate according to an embodiment of the technology.

FIG. 2 is a schematic perspective view of the laminate for describing Expression (1).

FIG. 3 is a schematic cross-sectional view of the laminate when peeling is started, for describing Expression (3).

FIG. 4 is a cross-sectional view of a configuration of a display device as a specific example of the laminate illustrated in FIG. 1.

FIG. 5 illustrates an overall configuration of the display device illustrated in FIG. 4.

FIG. 6 illustrates an example of a pixel drive circuit illustrated in FIG. 5.

FIG. 7A is a cross-sectional view for describing a method of manufacturing the display device illustrated in FIG. 4.

FIG. 7B is a cross-sectional view of a process after a process illustrated in FIG. 7A.

FIG. 7C is a cross-sectional view of a process after the process illustrated in FIG. 7B.

FIG. 8A is a cross-sectional view of a process after the process illustrated in FIG. 7C.

FIG. 8B is a cross-sectional view of a process after the process illustrated in FIG. 8A.

FIG. 8C is a cross-sectional view of a process after the process illustrated in FIG. 8B.

FIG. 9A is a cross-sectional view for describing a method of manufacturing a display device according to Modification 1.

FIG. 9B is a cross-sectional view of a process after a process illustrated in FIG. 9A.

FIG. 9C is a cross-sectional view of a process after the process illustrated in FIG. 9B.

FIG. 10A is a cross-sectional view for describing a method of manufacturing a display device according to Modification 2.

FIG. 10B is a cross-sectional view of a process after a process illustrated in FIG. 10A.

FIG. 10C is a cross-sectional view of a process after the process illustrated in FIG. 10B.

FIG. 11A is a cross-sectional view for describing a method of manufacturing a display device according to Modification 3.

FIG. 11B is a cross-sectional view of a process after a process illustrated in FIG. 11A.

FIG. 11C is a cross-sectional view of a process after the process illustrated in FIG. 11B.

FIG. 12A is a cross-sectional view of a process after the process illustrated in FIG. 11C.

FIG. 12B is a cross-sectional view of a process after the process illustrated in FIG. 12A.

FIG. 13 schematically illustrates a cross-sectional configuration of a display device according to a modification.

FIG. 14A is a perspective view of an appearance of Application example 1 viewed from a front side thereof.

FIG. 14B is a perspective view of the appearance of Application example 1 viewed from a rear side thereof.

FIG. 15 is a perspective view of an appearance of Application example 2.

DETAILED DESCRIPTION

Some embodiments of the technology are described below in detail with reference to the drawings. Incidentally, the description is given in the following order.

1. Embodiments (Examples in which an adhesive layer that satisfies Expression (1) and one or both of Expressions (2) and (3) is provided between a support substrate and a flexible device)

2. Modifications
   Modification 1 (An example in which a release layer is provided between the adhesive layer and the flexible device)
   Modification 2 (An example in which the release layer is provided between the support substrate and the adhesive layer)
   Modification 3 (An example in which a cut is so made on a flexible substrate in advance as to allow for separation)

3. Application examples

1. Embodiments

FIG. 1 illustrates a cross-sectional configuration of laminated layers (a laminate 1) for describing a laminate and a method of peeling the laminate according to some embodiments of the technology. The laminate 1 may include a device having flexibility (a flexible device 10) between a support substrate 11 and a support substrate 21. The flexible device 10 may include substrates having flexibility (flexible substrates 13 and 23) and a functional layer 14 that is provided between the substrates having flexibility. The laminate 1 may be formed in a process of manufacturing the flexible device 10, for example. The flexible device 10 may be a device such as a flexible display. The flexible substrates 13 and 23 may be fixed (firmly attached) onto the support substrates 11 and 21 with adhesive layers 12 and 22 in between, respectively. The laminate 1 according to the present embodiment includes the adhesive layers 12 and 22 one or both of which have adhesive force that satisfies Expression (1) described later. Also, it is made possible to peel off the support substrate 11 (and/or the support substrate 21) from the flexible device 10 easily at low cost, when peeling is performed on the foregoing laminate 1, by so preparing one or both of the adhesive layers 12 and 22 as to have adhesive force that satisfies Expression (1) and one or both of Expressions (2) and (3) described later.

The support substrate 11 and the support substrate 21 may support the flexible substrate 13 and the flexible substrate 23, respectively, thereby allowing for easier carrying in the manufacturing process and easier formation of the functional layer 14 described later. The support substrate 11 may be preferably made of a rigid material such as glass, quartz, and silicon. The support substrate 11 may be preferably a substrate that is greater in thickness than the flexible substrate 13. The support substrate 11 may have a thickness, for example, from 0.4 mm to 2 mm in view of factors such as mechanical strength and convenience in handling. Also, the support substrate 11 may preferably have a coefficient of linear expansion that is equal to or smaller than 10 ppm/K, taking into consideration a relationship between the support substrate 11 and the substrate 13.

The adhesive layer 12 and the adhesive layer 22 may fix the flexible substrate 13 and the flexible substrate 23 onto the support substrate 11 and the support substrate 21, respectively. The adhesive layer 12 may be provided on an entire surface in which the support substrate 11 and the flexible substrate 13 are in contact with each other, for example. The adhesive layer 22 may be provided on an entire surface in which the support substrate 21 and the flexible substrate 23 are in contact with each other, for example. The adhesive layers 12 and 22 may be formed by application using a method such as spin coating, die coating, and printing such as gravure printing. The adhesive layers 12 and 22 may each be made of any of adhesive agents used generally and adhesive tapes used generally. Specific examples thereof may include an acrylic bonding agent (or adhesive agent), an epoxy bonding agent, a siloxane bonding agent, a urethane bonding agent, a silane coupling agent, a natural rubber bonding agent, and a synthetic rubber bonding agent.

It is to be noted that, according to the present embodiment, if one of the adhesive layers (for example, the adhesive layer 12) has the adhesive force that satisfies Expression (1) and one or both of Expressions (2) and (3) described later, the other of the adhesive layers (for example, the adhesive layer 22) may be an adhesive tape. When using the adhesive tape, the adhesive tape may be attached to the support substrate 21 to thereby form the adhesive layer 22, following which the flexible substrate 23 may be fixed onto the adhesive layer 22 by means of a laminator, for example.

The flexible substrate 13 and the flexible substrate 23 may sandwich the functional layer 14 in between. Each of the flexible substrates 13 and 23 may be preferably made of a material that has a thermal shrinkage rate of 0.1% or lower in order to suppress warpage in substrates due to a difference in thermal shrinkage between the flexible substrate 13 and the support substrate 11 and between the flexible substrate 23 and the support substrate 21. Further, it is possible to suppress variation in dimension and deformation of the flexible substrates 13 and 23 by providing each of the flexible substrates 13 and 23 with a coefficient of linear expansion from about 0 ppm/K to about 15 ppm/K, taking into consideration the relationship between the flexible substrate 13 and the support substrate 11 and between the flexible substrate 23 and the support substrate 21. Specific examples of such a material may include a plastic material, that has a thickness from 5 μm to 200 μm, such as polyethylene terephthalate, polyethylene naphthalate, polyethersulfone, polyetherimide, polyether ether ketone, polyphenylene sulfide, polysulfone, polyarylate, polyimide, polyamide, polycarbonate, cellulose triacetate, polyolefin, polystyrene, polyethylene, polypropylene, polymethyl methacrylate, aramide, polyvinyl chloride, polyvinylidene chloride, epoxy resin, phenol resin, urea resin, melamine resin, silicon resin, and acrylic resin. It is to be noted that it is possible to use a material such as thin layer glass and thin layer ceramics that is reduced in thickness to the extent that the material shows flexibility.

The functional layer 14 may include layers having a function for a device such as an electronic circuit layer (a TFT layer 141), a display layer (a display layer 142), a sealing layer (a protective film 142E), and a color filter (a color filter layer 142G) (see FIG. 4). The electronic circuit layer (the TFT layer 141) may include components such as a TFT and various wiring patterns. It is to be noted that FIG. 1 illustrates the functional layer 14 as a single layer and describes that the functional layer 14 is collectively provided on the suppost substrate 11 side; however, this is not limitative. The functional layer 14 may have a multi-layered structure, for example. When the functional layer 14 has the multi-layered structure, the functional layer 14 may be provided as separated layers, i.e., a functional layer 14A and a functional layer 14B that are provided on the flexible substrates 13 and 23, respectively (for example, see FIG. 7C).

According to the present embodiment, one or both of the adhesive layer 12 and the adhesive layer 22 may be so prepared as to have the adhesive force that satisfies the following Expression (1) and one or both of the following Expressions (2) and (3). It is to be noted that the foregoing "adhesive force" specifically refers to close-attachment force (surface close-attachment force) between the support substrate 11 (or the support substrate 21) and the flexible substrate 13 (or the flexible substrate 23). Expression (1) expresses a condition for not causing damage on the substrate to be peeled off (the support substrate 11 (or the support substrate 21)) when the peeling is performed. Expressions (2) and (3) express conditions for preventing the substrate to be peeled off (the support substrate 11 (or the support substrate 21)) from lacking function of adsorbing and supporting because of lacking adsorption force. It is to be noted that the substrates are herein referred to as follows. A substrate that is to be peeled off is referred to as a "peel-off substrate A". Examples of the peel-off substrate A may include the support substrate 11. A substrate from which the peel-off substrate A is to be peeled off is referred to as a "remaining substrate C". Examples of the remaining substrate C may include the flexible substrate 13 and the functional layer 14. Also, an adhesive layer that firmly attaches the peel-off substrate A and the remaining substrate C to each other is referred to as an "adhesive layer B". It is made possible to easily peel off the peel-off substrate A from the remaining substrate B, by providing the adhesive layer B with adhesive force that satisfies Expression (1) and one or both of Expressions (2) and (3). More specifically, it is possible to peel off the support substrate 11 (or the support substrate 21) from the flexible device 10 without causing damage on the flexible device 10 in a process of peeling off the support substrate 11 (or the support substrate 21) described later. The respective parameters in Expression (1) and Expressions (2) and (3) are indicated in FIGS. 2 and 3.

$$A < \sqrt{\frac{x^2}{L^2 + 4x^2}} \cdot \left(\sigma_{max} - \frac{6E \cdot h}{L^2} \cdot x\right) \tag{1}$$

where "L" is a length of the peel-off substrate A in a direction in which the peel-off substrate A is peeled off, "h" is a thickness of the peel-off substrate A in millimeter, "x" is an allowable deformation amount of the peel-off substrate A, "E" is a Young's modulus of the peel-off substrate A, and "$\sigma_{max}$" is a limit bending stress of the peel-off substrate A.

$$B' < C - \rho h g \tag{2}$$

where "B" is adhesive force between the peel-off substrate A and the remaining substrate C at a peeling start part when the peeing is performed, "C" is peeling force in a vertical direction (in a Z-axis direction) when the peeling is performed, "$\rho$" is a density of the peel-off substrate A, "h" is the thickness of the peel-off substrate A in millimeter, and "g" is gravitational constant.

$$1 = \frac{r}{r-d} \cdot \sqrt{d(2r-d)} \tag{3}$$

where "l" is a width of a region in which the peeling is started, "d" is an amount of projection and warpage of the peel-off substrate A, and "r" is a curvature radius.

Expression (1) is derived as follows.

First, considering a process of peeling off the peel-off substrate A from the remaining substrate C, a condition for not causing damage on the peel-off substrate A is expressed by Expression (4). In Expression (4), "$\sigma_{max}$" is the limit bending stress of the peel-off substrate A, "$\sigma_{bend}$" is a stress in a tensile direction on the peel-off substrate A when the peel-off substrate A is bent, and "$\sigma_{bond}$" is a tensile stress that is caused on the remaining substrate C by the adhesive layer B. "$\sigma_{bend}$" is calculated from a secondary moment of the peel-off substrate A, and is expressed by Expression (5). In Expression (5), "L" is the length of the peel-off substrate A in the direction in which the peel-off substrate A is peeled off, "h" is the thickness of the peel-off substrate A, "x" is the allowable deformation amount of the peel-off substrate A, and "E" is the Young's modulus of the peel-off substrate A. "$\sigma_{bend}$" is expressed by Expression (6) based on mechanical resolution of force. In particular, when an angle at which the peeling is performed is small as in the technology, force at the time of the peeling is allowed to be approximated by the surface close-attachment force. In Expression (6), "A" is surface close-attachment force between the peel-off substrate A and the remaining substrate C, and "$\theta$" is a bending angle. Substituting Expressions (5) and (6) into Expression (4) gives Expression (7). Expression (7) is solved as Expression (8) for the surface close-attachment force A between the peel-off substrate A and the remaining substrate C. The bending angle "$\theta$" is expressed by Expression (9) using the length "L" of the peel-off substrate A in the direction in which the peel-off substrate A is peeled off and the variation amount "x" of the peel-off substrate A. Substituting Expression (9) into Expression (8) gives the foregoing Expression (1). It is to be noted that variables other than "x" in Expression (1) are fixed values that are based on characteristics of the material. "x" is also limited by a limit deformation amount "$x_{max}$", which accordingly leading to determination of allowable surface close-attachment force between the peel-off substrate A and the remaining substrate C.

$$\sigma_{max} < \sigma_{bend} + \sigma_{bond} \tag{4}$$

$$\sigma_{bend} = \frac{6E \cdot h}{L^2} \cdot x \tag{5}$$

$$\sigma_{bond} = \frac{2A}{\sin\frac{\theta}{2}} \tag{6}$$

$$\sigma_{max} < \frac{6E \cdot h}{L^2} \cdot x + \frac{2A}{\sin\frac{\theta}{2}} \tag{7}$$

$$A < \frac{1}{2}\sin\frac{\theta}{2} \cdot \left(\sigma_{max} - \frac{6E \cdot h}{L^2} \cdot x\right) \tag{8}$$

$$\sin\frac{\theta}{2} = \sqrt{\frac{4x^2}{L^2 + 4x^2}} \tag{9}$$

Expression (2) and Expression (3) are derived as follows.

Upon starting of the peeling, the peel-off substrate A receives force illustrated in FIG. 3 (the adhesive force (B') between the peel-off substrate A and the remaining substrate C at the peeling start part when the peeling is performed, substrate adsorption force (holding force) (C) with respect to the peel-off substrate A when the peeling is performed, and a weight ($\rho h g$) of the peel-off substrate A). A condition for allowing for normal peeling when the peeling is started is given as the foregoing Expression (2), based on the foregoing relationship. The substrate adsorption force (holding force), i.e., the peeling force C in the vertical direction (in the Z-axis direction) when the peeling is performed is decreased in value in a case where the remaining substrate C holds the peel-off substrate A in vacuum, largely limiting the adhesive force between the peel-off substrate A and the remaining substrate C. The length "l" of the peeling start part is expressed in a relationship illustrated in FIG. 3 by calculating the necessary condition for the peeling start part based on the foregoing condition. Referring to FIG. 3, it is necessary that at least Expression (2) is satisfied in a region that has the length "l" from an end of the substrate illustrated in FIG. 3. In FIG. 3, "r" is a curvature radius, "d" is the allowable amount of projection and warpage of the substrate, and "z" is a distance between the end of the peel-off substrate A and a point at which a line that extends from the end of the peel-off substrate A in a direction toward a center of a circle of curvature intersects the warped peel-off substrate A. An analysis is made as follows on what determines "l". First, Expression (10) is given based on the ratio in a triangle. Expression (10) is rearranged as Expression (11). "r", "z", and "l" in FIG. 3 are expressed by Expression (12), based on Pythagorean Theorem on triangles. Solving Expression (12) for "l" and substituting Expression (11) into "z" give the foregoing Expression (3). As described above, the length "l" that is necessary when the peeling is started is defined by the curvature radius "r" and the allowable amount "d" of projection and warpage of the substrate. It is to be noted that the curvature radius may be determined based on factors such as a specification of an apparatus that is used for peeling off the peel-off substrate A, and the physical property value of the peel-off substrate A. The allowable amount "d" of projection and warpage of the substrate may also be defined based on factors such as the specification of the equipment, and the physical property of the peel-off substrate A. Specifically, a condition for allowing for normal peeling of the peel-off substrate A under sufficient adsorption force is defined by the adhesive force "B" between the peel-off substrate A and the remaining substrate C at the peeling start part, and the length "l" of the peeling start part.

$$(r+z):r = z:d \quad (10)$$

$$z = \frac{dr}{r-d} \quad (11)$$

$$(r+z)^2 = l^2 + r^2 \quad (12)$$

$$l = \frac{r}{r-d} \cdot \sqrt{d(2r-d)} \quad (13)$$

(Display Device)

FIG. 4 illustrates a cross-sectional configuration of a display device (a display device 10A) as an example of the flexible device 10 illustrated in FIG. 1. The display device 10A may be a flexible ultra-thin organic light emitting color display, for example. The display device 10A may include a drive substrate 131, a counter substrate 231, and a functional layer 140 (for example, see FIG. 8A). The drive substrate 131 and the counter substrate 231 may have flexibility. The functional layer 140 may include the TFT layer 141 and the display layer 142, and be provided between the drive substrate 131 and the counter substrate 231. The present embodiment may involve a structure in which the drive substrate 131 is fixed onto the support substrate 11, and a display member (a functional layer 140A) is provided on the drive substrate 131. The display member (the functional layer 140A) may include the TFT layer 141 and the display layer 142 that includes components such as a lower electrode 142A, an organic layer 142B, an upper electrode 142C, and a protective film 142D. The counter substrate 231 may be fixed onto the support substrate 21. The color filter layer 142G and the sealing film 142E may be provided on the counter substrate 231. The color filter layer 142G and the sealing film 142E may be included in the display layer 142, and serve as a functional layer 140B. The functional layer 140A and the functional layer 140B may be opposed to each other, and the color filter layer 142G and the protective film 142D may be attached to each other with the sealing film 142E in between, following which the support substrate 11 and the support substrate 21 may be peeled off. This completes manufacturing of the display device 10A. It is to be noted that dimensions and shapes illustrated in FIG. 4 may be different from actual dimensions and shapes, as FIG. 4 only schematically illustrates the structure of the display unit 10A.

(Overall Configuration of Display Device 10A)

FIG. 5 illustrates an overall configuration of the display device 10A. The display device 10A may include a display region 310 in the middle of the drive substrate 131. The display device 10A may also include, for example, a signal line drive circuit 320 and a scanning line drive circuit 330 around the display region 310. The signal line drive circuit 320 and the scanning line drive circuit 330 may be drivers for image display, for example.

The display region 310 may be provided with a plurality of pixels 40R, 40G, and 40B and a pixel drive circuit 340. The pixels 40R, 40G, and 40B may be arranged two-dimensionally in a matrix. The pixel drive circuit 340 may be configured to drive the pixels 40R, 40G, and 40B. The pixel drive circuit 340 may include a plurality of signal lines 320A and a plurality of scanning lines 330A. The signal lines 320A may be arranged in a column direction. The scanning lines 330A may be arranged in a row direction. Each of the pixels 40R, 40G, and 40B may be provided for corresponding one of intersections at which the signal lines 320A intersect the respective scanning lines 330A. The pixels 40R, 40G, and 40B may be pixels that emit red light, green light, and blue light, respectively. Each of the signal lines 320A may be coupled to the signal line drive circuit 320, and each of the scanning lines 330A may be coupled to the scanning line drive circuit 330.

The signal line drive circuit 320 may provide each of the selected pixels 40R, 40G, and 40B, via corresponding one of the signal lines 320A, with a signal voltage of an image signal that is based on luminance information and is provided by an unillustrated signal supplier. Each of the signal lines 320A may receive the signal voltage from the signal line drive circuit 320.

The scanning line drive circuit 330 may include components such as a shift register that shifts (transmits) start pulses sequentially in synchronization with clock pulses supplied thereto. The scanning line drive circuit 330 may scan the pixels 40R, 40G, and 40B on a row-by-row basis, when the image signals are written into the respective pixels 40R, 40G, and 40B, and sequentially supply scanning signals to the respective scanning lines 330A. Each of the scanning lines 330A may receive a scanning signal from the scanning line drive circuit 330.

The pixel drive circuit 340 may be provided in the TFT layer 141. Referring to FIG. 6, the pixel drive circuit 340 may be an active drive circuit that includes a driving transistor Tr1, a writing transistor Tr2, a capacitor 30C provided between the driving transistor Tr1 and the writing transistor Tr2, and an organic light emitting element EL.

The respective layers included in the display device 10A may have the following configuration, for example. It is to be noted that the drive substrate 131 and the counter substrate 231 may correspond to the foregoing flexible substrate 13 and the foregoing flexible substrate 23, and have configurations that are similar to the configurations of the flexible substrate 13 and the flexible substrate 23, respectively.

The TFT layer 141 may specifically include components such as a TFT. The TFT may include a gate electrode 141A, a gate insulating film 141B, a semiconductor layer 141C serving as a channel layer, and source-drain electrodes 141D (141D1 and 141D2), for example. The foregoing components may be formed through processes of film formation and etching. The process of film formation may be performed by a method such as chemical vapor deposition (CVD). The source-drain electrodes 141D (141D1 and 141D2) may be covered with a planarizing layer 141E, for example. The planarizing layer 141E may be made of an insulating resin material such as polyimide, for example. The TFT may be either an inorganic TFT that includes an inorganic semiconductor layer or an organic TFT that includes an organic semiconductor layer. The TFT may serve as a switching element that is configured to select the pixels. It is to be noted that the TFT layer 141 may be provided with any other electronic device such as a 3D-display optical device, a touch panel, an optical functional layer such as a moth eye, or an MEMS device, besides the TFT.

The display layer 142 may include the lower electrode 142A, the organic layer 142B, and the upper electrode 142C in order from the drive substrate 131 (the planarizing layer 141E) side. The lower electrode 142A may serve as an anode electrode. The organic layer 142B may include a light emitting layer. The upper electrode 142C may serve as a cathode electrode. The display layer 142 may have a structure in which the upper electrode 142C is covered with the protective film 142D, and the counter substrate 231 provided with the color filter layer 142G is provided on the protective film 142D with the sealing film 142E in between. The organic layer 142B may include, for example, a hole injection layer, a hole transport layer, a light emitting layer, and an electron transport layer in order from the lower electrode 142A side. The light emitting layer may be provided for each of the pixels 40R, 40G, and 40B, or may be shared by the respective pixels 40R, 40G, and 40B. The layers other than the light emitting layer may be provided on an as-needed basis. The protective film 142D may prevent moisture from entering the organic layer 142B, for example. The protective film 142D may be made of an insulating material such as aluminum oxide ($Al_2O_3$), silicon oxide (SiO), silicon nitride (SiN), and silicon oxynitride (SiON), for example. It is to be noted that the pixels 40R, 40G, and 40B may be separated from one another by a pixel separation film 142F. A pixel region P (a light emitting region) of each of the pixels 40R, 40G, and 40B may be defined by the pixel separation film 142F. Also, the description above refers to the example in which the organic layer 142B is provided for each of the pixels; however, the configuration of the organic layer 142B is not limited thereto. An alternative configuration may be employed in which the organic layer 142B is provided as a film in a continuous form on the entire surface of the light emitting region P or the entire surface of the drive substrate 131, for example.

The color filter layer 142G may include, for example, unillustrated color filters corresponding to the respective pixels 40R, 40G, and 40B, and an unillustrated black matrix between the color filters. The color filter layer 142G may be provided on the counter substrate 231 side as described above, and may be attached to the protective film 142D with the sealing film 142E in between. The sealing film 142E may be made of a material that is used for the foregoing protective film 142D, or of a material such as ultraviolet (UV) curable resin or thermoplastic resin, for example.

(Method of Manufacturing Display Device 10A)

The foregoing display device 10A may be manufactured as follows, for example.

First, referring to FIG. 7A, the adhesive agent that has the adhesive force that satisfies the foregoing Expression (1) and one or both of the foregoing Expressions (2) and (3) may be applied onto the support substrate 11 that is made of a material such as glass, thereby forming the adhesive layer 12. Thereafter, referring to FIG. 7B, the drive substrate 131 having flexibility may be fixed onto the adhesive layer 12, following which a heating process may be performed at a temperature from 120° C. to 250° C. for 10 minutes to 60 minutes, for example. The heating process may forcibly induce thermal shrinkage of the drive substrate 131, thereby stabilizing behavior of the drive substrate 131 in the processes thereafter. This may also stabilize the adhesive force of the adhesive agent included in the adhesive layer 12.

Thereafter, referring to FIG. 7C, the functional layer 140A may be formed on the drive substrate 131 through laminating, in order, the TFT layer 141 as well as the lower electrode 142A, the organic layer 142B, the upper electrode 142C, the protective film 142D, and the pixel separation film 142F that configure part of the display layer 142. The counter substrate 231 and the functional layer 140B including the color filter layer 142G may also be formed on the support substrate 21, made of a material such as glass, with an adhesive agent in between through a process similar to that described above. The support substrate 11 provided with the functional layer 140A may be opposed to the support substrate 21 provided with the functional layer 140B. It is to be noted that the adhesive agent included in the adhesive layer 22 on the support substrate 21 side may satisfy any of the foregoing Expressions (1) to (3), or may satisfy none of the foregoing Expressions (1) to (3).

Thereafter, referring to FIG. 8A, the support substrate 11 and the support substrate 21 may be attached to each other with the sealing film 142E and an unillustrated sealing agent in between, thereby forming a laminate including the display device 10A corresponding to the flexible device 10. Thereafter, referring to FIG. 8B, a picking tape "a" may be attached to the peeling start part, and the attached picking tape "a" may be pulled in an arrow direction to peel off the support substrate 11, for example. Alternatively, the support substrate 11 may be peeled off by moving, in a rotating manner, a vacuum stage provided with a curvature. It is to be noted that the method of peeling off the support substrate 11 may be any method without being limited to the foregoing methods, in which any kind of adhesive stage, any kind of electrostatic force, etc. may be employed. Thereafter, the support substrate 21 may be peeled off in a way similar to that described above. This may complete the display device 10A illustrated in FIG. 8C.

The display device 10A may involve a configuration in which each of the pixels 40R, 40G, and 40B receives the scanning signal from the scanning line drive circuit 330 via the gate electrode 141A of the writing transistor Tr2, and the capacitor 30C retains the image signal supplied from the signal line drive circuit 320 via the writing transistor Tr2. Specifically, an ON-OFF control may be performed on the driving transistor Tr1 in response to the signal retained by the capacitor 30C. This may lead to application of a drive current to each of the pixels 40R, 40G, and 40B, generating light due to recombination of a hole and an electron. The generated light may pass through the upper electrode 142C, the protective film 142D, the sealing film 142E, and the counter substrate 230 to exit to the outside.

According to the laminate, the method of peeling the laminate, and the method of manufacturing the flexible device described above, the adhesive agent having the adhesive force that satisfies the foregoing Expression (1) and one or both of the foregoing Expressions (2) and (3) is used to form at least the adhesive layer (for example, the adhesive layer 12) that is to be peeled off first, out of the adhesive layer 12 and the adhesive layer 22 that firmly attach the drive substrate 131 and the counter substrate 231 to the support substrate 11 and the support substrate 21, respectively, that are included in the display device 10A corresponding to the flexible device 10. This makes it possible to perform the peeling without causing damage on the support substrate 11 or without burdening the functional layer 140.

In general, a flexible device, such as a so-called flexible display, in which various devices such as display elements are provided on a flexible substrate is allowed to be manufactured using an existing manufacturing line of a display device, after the flexible substrate is fixed onto the substrate having rigidity such as glass. This makes it possible to manufacture the flexible device at low cost. However, it may be difficult to peel off one or both of rigid substrates (for example, glass substrates) from the device which is sandwiched by the rigid substrates. For example, the glass substrate may be broken in the middle of the peeling, making it difficult to peel off the glass substrate in some cases. Another case has involved a concern that the glass substrate may not have enough adsorption force when the peeling is started, making it difficult to peel off the glass substrate.

The foregoing methods have been employed to address such concerns in which a metal layer is provided on the glass substrate and the metal layer is irradiated with the laser to peel off the glass substrate, and in which an adhesive agent is applied only onto part such as a periphery of the flexible substrate to fix the glass substrate thereon. However, the foregoing methods have involved concerns such as an increase in cost due to the use of the laser, degradation of the functional layer due to laser application, and a positional shift due to insufficient fixing force.

In contrast, the present embodiment makes it possible to mechanically peel off the support substrate 11 and the drive substrate 131 (the flexible substrate 13) from each other by so preparing the adhesive layer (the adhesive layer 12) between the substrates that are subjected to the peeling first (in the present embodiment, the drive substrate 131 (the flexible substrate 13) and the support substrate 11) as to have the adhesive force that satisfies the foregoing Expression (1) and one or both of the foregoing Expressions (2) and (3), for example.

As described above, according to the laminate, the method of peeling the laminate, and the method of manufacturing the flexible device of the present embodiments, the adhesive layer 12 may be formed, between the support substrate 11 and the drive substrate 131 (the flexible substrate 13), that has the adhesive force that satisfies the foregoing Expression (1) and one or both of the foregoing Expressions (2) and (3). This makes it possible to mechanically peel off the support substrate 11 and the drive substrate 131 (the flexible substrate 13) from each other easily at low cost, without causing damage on the support substrate 11 or without burdening the functional layer 140 provided on the drive substrate 131 side.

It also allows for the peeling without performing a process such as laser application. This makes it possible to suppress degradation of the layers, such as the TFT layer 141 and the display layer 142, on the support substrate 11. It also makes it possible to apply the adhesive layer 12 and firmly attach the adhesive layer 12 onto the entire surface between the support substrate 11 and the drive substrate 131, allowing for manufacturing a high-resolution display device.

Modifications (Modifications 1 and 2) of the foregoing embodiments are described below. Components that are the same as those in the foregoing embodiments will be denoted with the same numerals and will not be further described where appropriate in the description below.

2. Modifications

Modification 1

FIGS. 9A to 9C illustrate another example (Modification 1) of the method of manufacturing the display device 10A in the embodiment described above. This method may involve formation of a release layer 15 between the flexible substrate 13 and an adhesive layer (for example, the adhesive layer 12) that is so prepared to have adhesive force that satisfies the foregoing Expression (1) and one or both of the foregoing Expressions (2) and (3). The release layer 15 may have smaller adhesive force. Except for this point, the display device 10A may be manufactured in a manner similar to that in the embodiment described above, according to Modification 1.

The release layer 15 may reduce the adhesive force between the adhesive layer 12 and the flexible substrate 13. The release layer 15 may be made of an inorganic material, for example. Specific examples thereof may include silicon nitride ($SiN_x$) and silicon oxide ($SiO_2$). The release layer 15 may preferably have a thickness from 50 nm to 500 nm both inclusive, for example. The release layer 15 may be preferably thin, taking into consideration that there is a possibility that the release layer 15 may be attached onto the flexible substrate 13 side through the peeling process. One reason for this is because provision of the release layer 15 having an excessively-large thickness on the flexible substrate side from which light exits may cause a decline in transmittance, blocking the light emitted by the organic EL and resulting in a decline in light emitting efficiency.

The display device 10A according to the present modification may be manufactured as follows.

First, referring to FIG. 9A, a film such as an SiN film may be formed on the drive substrate 131 by a method such as CVD to form the release layer 15. Also, the adhesive agent having the adhesive force that satisfies the foregoing Expression (1) and one or both of the foregoing Expressions (2) and (3) may be applied onto the support substrate 11 to form the adhesive layer 12 in a manner similar to that in the foregoing embodiment. Thereafter, referring to FIG. 9B, the adhesive layer 12 and the release layer 15 may be opposed to each other and attached to each other. Thereafter, the functional layer 140 may be formed on the drive substrate 131, following which the counter substrate 231 may be attached to the functional layer 140 in a manner similar to that in the foregoing embodiment. The counter substrate 231 may have been firmly attached onto the support substrate 21 with the adhesive layer 22 in between, in another process. This may complete the formation of the laminate that includes the display device 10A corresponding to the flexible device 10 as illustrated in FIG. 9C.

Thereafter, the support substrate 11 and the support substrate 21 may be peeled off by a method similar to that in the foregoing embodiment. This may complete the display unit 10A.

As described above, the present modification makes it possible to reduce an adhesive amount between the drive substrate 131 and the adhesive layer 12 by forming the release layer 15 that has the smaller adhesive force between the drive substrate 131 and the adhesive layer 12 that is so prepared to have the adhesive force that satisfies the foregoing Expression (1) and one or both of the foregoing Expressions (2) and (3). This makes it possible to peel off the support substrate 11 with smaller force. In other words, it is possible to suppress degradation of characteristics of the functional layer 140 such as the display layer 142, resulting from the burden put on the functional layer 140 when the peeling is performed, for example. This makes it possible to provide a flexible device with higher reliability.

The present modification also involves the peeling between the drive substrate 131 and the release layer 15, thereby reducing an amount of the adhesive agent attached onto the drive substrate 131 side after the peeling is performed. This improves visibility of the display device 10A, and prevents attachment of a substance such as dust due to the remained adhesive agent.

It is to be noted that the present modification has a configuration in which the release layer 15 is provided only on the support substrate 11 side. However, the release layer 15 may be provided on both of the support substrate 11 side and the support substrate 21 side.

Modification 2

FIGS. 10A to 10C illustrate another example (Modification 2) of the method of manufacturing the display device 10A according to the embodiment and Modification 1 described above. The present method may involve formation of the release layer 15 that has smaller adhesive force between the support substrate 11 and an adhesive layer (for example, the adhesive layer 12) that is so prepared as to have the adhesive force that satisfies the foregoing Expression (1) and one or both of the foregoing Expressions (2) and (3), for example. Except for this point, the display device 10A may be manufactured in a manner similar to that in the foregoing embodiment, according to Modification 2.

The display device 10A of the present modification may be manufactured as follows.

First, referring to FIG. 10A, the release layer 15 and the adhesive layer 12 may be formed in order on the support substrate 11. More specifically, a film such as an SiN film may be formed on the support substrate 11 by a method such as CVD to form the release layer 15, following which the adhesive agent having the adhesive force that satisfies the foregoing Expression (1) and/or the foregoing Expression (2) and/or the foregoing Expression (3) may be applied onto the release layer 15 to form the adhesive layer 12. Thereafter, referring to FIG. 10B, the drive substrate 131 may be firmly attached onto the adhesive layer 12, following which the functional layer 140A may be formed. Thereafter, the counter substrate 231 may be attached onto the functional layer 140A. The counter substrate 231 may have been firmly attached onto the support substrate 21 with the adhesive layer 22 in between in another process. This may complete the formation of the laminate that includes the display device 10A corresponding to the flexible device 10 as illustrated in FIG. 10C.

Thereafter, the support substrate 11 and the support substrate 21 may be peeled off by a method similar to that in the foregoing embodiment. This may complete the display device 10A.

As described above, the present modification may involve formation of the release layer 15 that has the smaller adhesive force between the support substrate 11 and the adhesive layer 12 that is so prepared as to have the adhesive force that satisfies the foregoing Expression (1) and/or the foregoing Expression (2) and/or the foregoing Expression (3). It is therefore possible to reduce the amount of adhesion between the support substrate 11 and the adhesive layer 12, thereby making it possible to peel off the support substrate 11 with smaller force. In other words, it is possible to suppress damage caused on the functional layer 14 such as the display layer 142, and provide a flexible device with higher reliability.

It is to be noted that the present modification has a configuration in which the release layer 15 is provided on one of the support substrate sides. However, the release layer 15 may be provided on the other of the support substrate sides (in the present modification, on the support substrate 21 side) as with Modification 1 described above, or alternatively, the release layer 15 may be provided between the support substrate 11 and the adhesive layer 12 as well as between the support substrate 21 and the adhesive layer 22.

Moreover, a combination of Modification 1 and Modification 2 may be employed to manufacture the display device 10A. For example, the release layer 15 may be provided between the support substrate 11 and the adhesive layer 12 on the support substrate 11 side while a release layer 24 may be provided between the adhesive layer 22 and the counter substrate 231 on the support substrate 21 side, or vice versa.

Moreover, the physical properties such as the adhesive force of the adhesive layer 12 that satisfies the foregoing Expression (1) and one or both of the foregoing Expressions (2) and (3) may be controlled by means of a stimulus from outside (such as light, heat, and electromagnetic force).

Modification 3

FIGS. 11A to 12B illustrate part of a process of manufacturing a display device 10A according to Modification 3 of the foregoing embodiment. Description is given according to the present modification of a process in which, for example, a plurality of flexible devices 10 that are to be the display devices 10A may be formed on a large substrate, and another substrate may be attached to the large substrate, following which the flexible devices 10 may be separated from one another. It is to be noted that the description is given below referring to the display device 10A as an example.

In general, when a plurality of flexible devices are manufactured collectively on a large substrate, a functional layer (for example, a color filter and a sealing film) is formed on a flexible substrate (for example, a counter substrate) that is firmly attached onto one of a pair of support substrates, following which a cut is made on the flexible substrate together with the functional layer and another flexible substrate (for example, a drive substrate provided with a component such as an organic film including a light emitting layer) that is firmly attached onto the other of the support substrates is attached to the functional layer. Thereafter, the respective support substrates are peeled off, followed by separation based on the cut. This allows for collectively manufacturing the plurality of flexible devices.

However, making the cut after formation of the functional layer may cause damage such as a crack on the functional layer. This may lead to degradation of reliability of the device.

The present modification addresses such a concern by collectively manufacturing the plurality of flexible devices 10 (the plurality of display devices 10A) as follows. First, referring to FIG. 11A, a plurality of color filter layers 142G may be formed, as the functional layers 14, on the counter substrate 231 that is large in size and is firmly attached onto the support substrate 21 with the unillustrated adhesive layer 22 in between. Thereafter, referring to FIG. 11B, a cut CL may be made on a periphery of each of the color filter layers 142G. Thereafter, referring to FIG. 11C, the sealing film 142E may be formed on the color filter layers 142G, following which the drive substrate 131 may be attached onto the sealing film 142E, as illustrated in FIG. 12A. The drive substrate 131 may be firmly attached onto the support substrate 11 with the unillustrated adhesive layer 12 in between, and may have been provided with layers such as the TFT layer 141 and the organic layer 142B in another process. Finally, referring to FIG. 12B, each of the support substrate 11 and the support substrate 21 may be peeled off, and the flexible devices 10 may be separated from one another based on the cut CL. This completes the manufacturing of the plurality of display devices 10A.

FIG. 13 schematically illustrates a cross-sectional configuration of the flexible device 10 taken along a line I-I in FIG. 12A. Employing the method according to the present modification makes it possible to prevent damage caused on the sealing film 142E, and allow for formation of the sealing film 142E on an end surface of the color filter layer 142G. It is to be noted that the description has been given referring to the process of manufacturing the counter substrate 231 side as an example. However, the foregoing method is also applicable to the process of manufacturing the drive substrate 131 side. Incidentally, the layers from the TFT layer 141 up to the upper electrode 142C corresponding to the functional layer may be formed and a cut may be made on the formed layers from the TFT layer 141 up to the upper electrode 142C, following which the protective film 142D may be formed in such a case, for example.

As described above, according to the present modification, the color filter layers 142G (or components such as the organic layers 142B and the upper electrodes 142C) may be formed on the counter substrate 231 (or the drive substrate 131) that is firmly attached to the support substrate 21 (or the support substrate 11), and the cut CL may be made thereafter on the color filter layers 142G and the counter substrate 231 (or on the layers from the upper electrode 142C to the drive substrate 131), following which the sealing film 142E (or the protective film 142D) may be formed that protects the color filter layers 142G (or the components such as the organic layers 142B). This prevents the damage caused on the sealing film 142E (or the protective film 142D), and improves manufacturing yields. Also, formation of, for example, the sealing film 142E (or the protective film 142D) made of an inorganic material such as SiN and $Al_2O_3$ on the end surfaces of the color filter layers 142G and the counter substrate 231 (or components such as the organic layer 142B and the TFT layer 141) makes it possible to suppress entering of substances such as moisture into the layer made of an organic material, and therefore improve reliability.

It is to be noted that the description has been given referring to the example in which the plurality of flexible devices 10 are manufactured collectively. However, the manufacturing method of the present modification is not limited thereto. The manufacturing method according to the present modification is also applicable to a case where one flexible device 10 is manufactured on one substrate.

3. Application Examples

The display device 10A fabricated by any of the methods according to the embodiment and Modifications 1 to 3 is applicable to a display device in an electronic apparatus in various fields that displays, as an image or a picture, an image signal supplied from outside or an image signal generated inside the electronic apparatus. Examples of the electronic apparatus may include a television apparatus, a digital camera, a laptop personal computer, a portable terminal apparatus such as a mobile phone, and a video camera.

Application Example 1

FIGS. 14A and 14B each illustrate an appearance configuration of an electronic book. The electronic book may include a display section 110, a non-display section 120, and an operation section 130, for example. It is to be noted that the operation section 130 may be provided on a front surface of the non-display section 120 as illustrated in FIG. 14A, or may be provided on a top surface of the electronic book as illustrated in FIG. 14B. The display section 110 may include the display device 10A. It is to be noted that the display device 10A may be mounted on an apparatus such as personal digital assistants (PDAs) that have configurations similar to the configuration of the electronic book illustrated in FIGS. 14A and 14B.

Application Example 2

FIG. 15 illustrates an appearance of a tablet personal computer. The tablet personal computer may include a touch panel section 410 and a housing 420, for example. The touch panel section 410 may include the foregoing display device 10A.

The technology has been described above referring to the embodiments and Modifications 1 to 3. However, the technology is not limited to the embodiments, etc. described above and may be variously modified. For example, the description has been given above according to the embodiments, etc. referring to the case where the display device 10A includes the TFT layer 141, i.e., the case where the display device 10A is an active-matrix display device. However, the display device 10A may be a passive-matrix display device.

Moreover, the material, the thickness, the forming method, the forming condition, etc. of each of the parts are not limited to those described above according to the embodiments, etc. and the application example thereof. Any other material, any other thickness, any other forming method, any other forming condition, etc. may be employed. For example, description has been given above according to the embodiments, etc. referring to the example in which the adhesive layer 12 or 22 is formed on the entire surface of the support substrate 11 or 21, respectively; however, this is not limitative. Alternatively, the adhesive layer 12 or 22 may be formed to have a predetermined shape, for example, a pattern that prevents the adhesive agent from being present on a so-called display section and a region around the display section of the display device 10A.

Moreover, description has been given above according to the embodiments, etc. referring to the example in which the display device includes, as pixels, the three types of pixels, i.e., the red pixel 40R, the green pixel 40G, and the blue pixel 40B. However, a white pixel or a yellow pixel may be used in combination with the foregoing pixels of the three colors.

Moreover, the display device 10A according to the foregoing embodiments, etc. is also applicable to a display device that is provided with various display elements such as an inorganic EL element, a liquid crystal element, and an electrophoresis display element, besides the display device provided with the organic EL element.

Moreover, the display device 10A according to the foregoing embodiments, etc. may include other layers. For example, an inorganic film may be formed on the functional layer 14, such as the display layer 142, side of each of the flexible substrates 13 and 23. The inorganic film may be made of a material similar to that of the release layer 15. The thus-formed inorganic film may serve as a barrier layer, making it possible to reduce entering of moisture into the organic film that configures the display layer 142, for example. This makes it possible to improve reliability.

It is to be noted that the effects described in the specification are mere examples. The effect of the technology is not limited thereto, and may include other effects.

It is to be noted that the technology may also have the following configurations.

[1]

A method of peeling a laminate, the method including:

forming a first adhesive layer on a first substrate, the first adhesive layer having adhesive force that satisfies the following Expression (1) and one or both of the following Expressions (2) and (3);

firmly attaching a second substrate onto the first adhesive layer;

forming a first functional layer on the second substrate; and peeling off the first substrate from the second substrate, $$A < \sqrt{\frac{x^2}{L^2 + 4x^2}} \cdot \left(\sigma_{max} - \frac{6E \cdot h}{L^2} \cdot x\right) \quad (1)$$

where "L" is a length of the first substrate in a direction in which the first substrate is peeled off, "h" is a thickness of the first substrate in millimeter, "x" is an allowable deformation amount of the first substrate, "E" is a Young's modulus of the first substrate, and "$\sigma_{max}$" is a limit bending stress of the first substrate, $$B' < C - \rho h g \quad (2)$$

where "B" is adhesive force between the first substrate and the second substrate at a peeling start part when the peeing is performed, "C" is peeling force in a vertical direction (in a Z-axis direction) when the peeling is performed, "$\rho$" is a density of the first substrate, "h" is the thickness of the first substrate in millimeter, and "g" is gravitational constant, $$1 = \frac{r}{r-d} \cdot \sqrt{d(2r-d)} \quad (3)$$

where "l" is a width of a region in which the peeling is started,

"d" is an amount of projection and warpage of the first substrate, and

"r" is a curvature radius.

[2]

The method according to [1], wherein the first adhesive layer has the adhesive force that satisfies the Expression (1) and both of the Expressions (2) and (3).

[3]

The method according to [1] or [2], further including forming a release layer on a surface, of the second substrate, that is to be firmly attached onto the first adhesive layer, before the firmly attaching of the second substrate onto the first adhesive layer.

[4]

The method according to [1] or [2], further including forming a release layer on the first substrate before the forming of the first adhesive layer.

[5]

The method according to [3] or [4], wherein the release layer is made of an inorganic material.

[6]

The method according to any one of [1] to [5], further including, upon the forming of the first functional layer on the second substrate that is firmly attached onto the first substrate with the first adhesive layer in between, making a cut on a peripheral part of the first functional layer and forming thereafter a protective film on the first functional layer.

[7]

The method according to any one of [1] to [6], further including:

firmly attaching a fourth substrate onto a third substrate with a second adhesive layer in between;

attaching the fourth substrate and the second substrate to each other to cause the fourth substrate and the second substrate to be opposed to each other; and peeling off the third substrate followed by the peeling off of the first substrate, after the attaching of the fourth substrate and the second substrate to each other.

[8]

The method according to [7], further including forming a second functional layer on the fourth substrate after the firmly attaching of the fourth substrate onto the third substrate.

[9]

The method according to [8], wherein each of the first functional layer and the second functional layer is one of a semiconductor layer, a display layer, and a color filter.

[10]

The method according to any one of [7] to [9], wherein each of the first substrate and the third substrate has rigidity.

[11]

The method according to any one of [7] to [10], wherein each of the second substrate and the fourth substrate has flexibility.

[12]

The method according to any one of [3] to [11], wherein the second adhesive layer has adhesive force that satisfies the Expression (1) and one or both of the Expressions (2) and (3).

[13]

A method of manufacturing a flexible device, the method including:

forming an adhesive layer on a first substrate, the adhesive layer having adhesive force that satisfies the following Expression (1) and one or both of the following Expressions (2) and (3);

fixing a second substrate onto the adhesive layer, the second substrate having flexibility;

forming a functional layer on the second substrate; and peeling off the first substrate from the second substrate, $$A < \sqrt{\frac{x^2}{L^2 + 4x^2}} \cdot \left(\sigma_{max} - \frac{6E \cdot h}{L^2} \cdot x\right) \quad (1)$$

where "L" is a length of the first substrate in a direction in which the first substrate is peeled off, "h" is a thickness of the first substrate in millimeter, "x" is an allowable deformation amount of the first substrate, "E" is a Young's modulus of the first substrate, and "$\sigma_{max}$" is a limit bending stress of the first substrate, $$B' < C - \rho h g \quad (2)$$

where "B" is adhesive force between the first substrate and the second substrate at a peeling start part when the peeing is performed, "C" is peeling force in a vertical direction (in a Z-axis direction) when the peeling is performed, "ρ" is a density of the first substrate,
"h" is the thickness of the first substrate in millimeter, and
"g" is gravitational constant, $$1 = \frac{r}{r-d} \cdot \sqrt{d(2r-d)} \quad (3)$$

where "l" is a width of a region in which the peeling is started,
"d" is an amount of projection and warpage of the first substrate, and
"r" is a curvature radius.

[14]
A laminate, including:
a first substrate having rigidity;
a second substrate having flexibility; and
an adhesive layer provided between the first substrate and the second substrate, and having adhesive force that satisfies the following Expression (1), $$A < \sqrt{\frac{x^2}{L^2 + 4x^2}} \cdot \left(\sigma_{max} - \frac{6E \cdot h}{L^2} \cdot x\right) \quad (1)$$

where "L" is a length of the first substrate in a direction in which the first substrate is peeled off,
"h" is a thickness of the first substrate in millimeter,
"x" is an allowable deformation amount of the first substrate,
"E" is a Young's modulus of the first substrate, and
"$\sigma_{max}$" is a limit bending stress of the first substrate.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "about" as used herein can allow for a degree of variability in a value or range. Moreover, no element or component in this disclosure is intended to be dedicated to the public regardless of whether the element or component is explicitly recited in the following claims.

What is claimed is:

1. A method of peeling a laminate, the method comprising:
   forming a first adhesive layer on a first substrate, the first adhesive layer having adhesive force that satisfies the following Expression (1) and one or both of the following Expressions (2) and (3);
   firmly attaching a second substrate onto the first adhesive layer;
   forming a first functional layer on the second substrate; and
   peeling off the first substrate from the second substrate, $$A < \sqrt{\frac{x^2}{L^2 + 4x^2}} \cdot \left(\sigma_{max} - \frac{6E \cdot h}{L^2} \cdot x\right) \quad (1)$$

where "L" is a length of the first substrate in a direction in which the first substrate is peeled off,
"h" is a thickness of the first substrate in millimeter,
"x" is an allowable deformation amount of the first substrate,
"E" is a Young's modulus of the first substrate, and
"$\sigma_{max}$" is a limit bending stress of the first substrate, $$B' < C - \rho h g \quad (2)$$

where "B" is adhesive force between the first substrate and the second substrate at a peeling start part when the peeling is performed,
"C" is peeling force in a vertical direction (in a Z-axis direction) when the peeling is performed,
"ρ" is a density of the first substrate,
"h" is the thickness of the first substrate in millimeter, and
"g" is gravitational constant, $$1 = \frac{r}{r-d} \cdot \sqrt{d(2r-d)} \quad (3)$$

where "l" is a width of a region in which the peeling is started,
"d" is an amount of projection and warpage of the first substrate, and
"r" is a curvature radius.

2. The method according to claim 1, wherein the first adhesive layer has the adhesive force that satisfies the Expression (1) and both of the Expressions (2) and (3).

3. The method according to claim 1, further comprising forming a release layer on a surface, of the second substrate, that is to be firmly attached onto the first adhesive layer, before the firmly attaching of the second substrate onto the first adhesive layer.

4. The method according to claim 3, wherein the release layer is made of an inorganic material.

5. The method according to claim 1, further comprising forming a release layer on the first substrate before the forming of the first adhesive layer.

6. The method according to claim 1, further comprising, upon the forming of the first functional layer on the second substrate that is firmly attached onto the first substrate with the first adhesive layer in between, making a cut on a peripheral part of the first functional layer and forming thereafter a protective film on the first functional layer.

7. The method according to claim 1, further comprising:
   firmly attaching a fourth substrate onto a third substrate with a second adhesive layer in between;
   attaching the fourth substrate and the second substrate to each other to cause the fourth substrate and the second substrate to be opposed to each other; and
   peeling off the third substrate followed by the peeling off of the first substrate, after the attaching of the fourth substrate and the second substrate to each other.

8. The method according to claim 7, further comprising forming a second functional layer on the fourth substrate after the firmly attaching of the fourth substrate onto the third substrate.

9. The method according to claim 8, wherein each of the first functional layer and the second functional layer is one of a semiconductor layer, a display layer, and a color filter.

10. The method according to claim 7, wherein each of the first substrate and the third substrate has rigidity.

11. The method according to claim 7, wherein each of the second substrate and the fourth substrate has flexibility.

12. The method according to claim 7, wherein the second adhesive layer has adhesive force that satisfies the Expression (1) and one or both of the Expressions (2) and (3).

13. A method of manufacturing a flexible device, the method comprising:
 forming an adhesive layer on a first substrate, the adhesive layer having adhesive force that satisfies the following Expression (1) and one or both of the following Expressions (2) and (3);
 fixing a second substrate onto the adhesive layer, the second substrate having flexibility;
 forming a functional layer on the second substrate; and
 peeling off the first substrate from the second substrate, $$A < \sqrt{\frac{x^2}{L^2 + 4x^2}} \cdot \left( \sigma_{max} - \frac{6E \cdot h}{L^2} \cdot x \right) \tag{1}$$

where "L" is a length of the first substrate in a direction in which the first substrate is peeled off,
"h" is a thickness of the first substrate in millimeter,
"x" is an allowable deformation amount of the first substrate,
"E" is a Young's modulus of the first substrate, and
"$\sigma_{max}$" is a limit bending stress of the first substrate, $$B' < C - \rho h g \tag{2}$$

where "B" is adhesive force between the first substrate and the second substrate at a peeling start part when the peeling is performed, "C" is peeling force in a vertical direction (in a Z-axis direction) when the peeling is performed,
"$\rho$" is a density of the first substrate,
"h" is the thickness of the first substrate in millimeter, and
"g" is gravitational constant, $$1 = \frac{r}{r - d} \cdot \sqrt{d(2r - d)} \tag{3}$$

where "l" is a width of a region in which the peeling is started,
"d" is an amount of projection and warpage of the first substrate, and
"r" is a curvature radius.

14. A laminate, comprising:
 a first substrate having rigidity;
 a second substrate having flexibility; and
 an adhesive layer provided between the first substrate and the second substrate, and having adhesive force that satisfies the following Expression (1), $$A < \sqrt{\frac{x^2}{L^2 + 4x^2}} \cdot \left( \sigma_{max} - \frac{6E \cdot h}{L^2} \cdot x \right) \tag{1}$$

where "L" is a length of the first substrate in a direction in which the first substrate is peeled off,
"h" is a thickness of the first substrate in millimeter,
"x" is an allowable deformation amount of the first substrate,
"E" is a Young's modulus of the first substrate, and
"$\sigma_{max}$" is a limit bending stress of the first substrate.

* * * * *